United States Patent
Chuang

(12) 
(10) Patent No.: US 6,653,616 B2
(45) Date of Patent: Nov. 25, 2003

(54) DEVICE FOR PROCESSING OUTPUT SIGNALS FROM A PHOTO-DIODE

(75) Inventor: Pei-Sung Chuang, Taipei Hsien (TW)

(73) Assignee: Alcor Micro, Corp., Taipei (TW)

( * ) Notice: Subject to any disclaimer, the term of this patent is extended or adjusted under 35 U.S.C. 154(b) by 2 days.

(21) Appl. No.: 10/042,330

(22) Filed: Jan. 11, 2002

(65) Prior Publication Data

US 2003/0132368 A1 Jul. 17, 2003

(51) Int. Cl.[7] .................................................. H01J 40/14
(52) U.S. Cl. ............................. 250/214 R; 250/231.13
(58) Field of Search ..................... 250/214 R, 214 AG, 250/214 C, 214 DC, 231.13, 231.16; 356/73, 218, 221, 222, 223; 377/6, 12

(56) References Cited

U.S. PATENT DOCUMENTS

| | | | | |
|---|---|---|---|---|
| 3,878,369 A | * | 4/1975 | Gahwiler | 377/12 |
| 4,410,798 A | * | 10/1983 | Breslow | 250/231.14 |
| 4,412,175 A | * | 10/1983 | Maynarez | 324/71.1 |
| 4,688,268 A | * | 8/1987 | Holland | 359/194 |
| 4,701,609 A | * | 10/1987 | Koishi et al. | 250/205 |
| 5,036,289 A | * | 7/1991 | Duran | 327/94 |
| 5,929,789 A | * | 7/1999 | Barbehenn | 341/11 |
| 6,167,011 A | * | 12/2000 | Sun et al. | 369/44.41 |

* cited by examiner

Primary Examiner—Diego Gutierrez
Assistant Examiner—Lydia M. De Jesús
(74) Attorney, Agent, or Firm—Troxell Law Office PLLC

(57) ABSTRACT

A device for processing output signals from a photo-diode uses a comparative conversion circuit to convert an analog output signal generated from a photo-diode to a square wave digital signal; wherein, a reference circuit obtains a reference signal by capturing the analog output signal from the photo-diode, feeds it back to a feedback logic unit for timing the high or low electric potential based on the reference signal; when the low electric potential time is too long, the entire electric potential and the wave crest value time of the output signal are adjusted to make the final output square wave digital signal of the comparative conversion circuit acquire a symmetric wave correction.

8 Claims, 5 Drawing Sheets

DEVICE FOR PROCESSING OUTPUT SIGNALS FROM A PHOTO-DIODE

BACKGROUND OF THE INVENTION

1) Field of the Invention

The present invention relates to a device for processing output signals from a photo-diode, more especially to a device for pairing up the elements of a light-emitting diode and a photo-diode, converting a digital output signal with the photo-diode element and correcting the signal wave shape.

2) Description of the Prior Art

Accordingly, the elements of a light-emitting diode (LED) and a photo-diode have been extensively applied to the insolated circuit for isolating signal transmission, remote-controlling signal transmission, interrupting circuit, being an emitter or receiver of a photoelectric encoder in an encoding wheel; for any of the abovementioned applications, the elements of the LED and the photo-diode must be used in pairs; however, influenced by the factors of manufacturing procedure, material, the chip package and the light case, the paired result of every LED and photo-diode is not always desirable and extremely subjected to have difference due to the nature or the long-term deterioration of the elements of the LED and the photodiode; therefore, the output analog signal from the element of the photo-diode might have deviation or distortion; as shown in FIG. 6, the time (T) of the highest electric potential (the positive semi-cycle crest value) in a signal (A) is too long, so the wave deforms, deviates and distorts; when being converted to a digital signal, as shown in FIG. 6, signal (B) also has same the shortcomings of signal deviation and distortion; thereby, the wave shape of signal (B) is not symmetric and that disadvantageously affects applying the photo-diode to a circuit.

Therefore, before pairing up the LED and the photo-diode, the industrials have to first use an apparatus for testing, then categorize them before applying them to the circuit product on the production line; that is time and labor consuming; furthermore, to manually test the pairing-up will relatively increase the manufacturing cost of the LED and the photo-diode and that does not meet the effect of industrial utilization.

SUMMARY OF THE INVENTION

Therefore, the primary objective of the present invention is to provide a device for processing output signals from a photo-diode which comprises a comparative conversion circuit, a reference circuit, a feedback logic unit and a programmable adjusting resistor to arbitrarily pair up the photo-diode without manually testing and matching.

Another objective of the present invention is to provide a device for processing output signals from a photo-diode, wherein, the reference circuit and the feedback logic unit can precisely and automatically feed back and provide the wave electric potential and time of an analog output signal of the photo-diode element to more precisely correct the wave of the analog output signal of the photo-diode through a precise feedback signal.

Yet another objective of the present invention is to provide a device for processing output signals from a photo-diode, wherein, the said programmable adjusting resistor can be controlled and driven by a digital signal to precisely and automatically correct the analog and digital output signal of the photo-diode to make the wave of the digital output signal of the photo-diode acquire a closed loop feedback adjustment.

For achieving the abovementioned objectives, the present invention of a device for processing output signals from a photo-diode comprises a comparative conversion circuit, a reference circuit, a feedback logic unit and a programmable adjusting resistor; the said comparative conversion circuit converts an analog output signal generated from a photo-diode to a square wave digital signal; the reference circuit obtains a reference signal by capturing the analog output signal from the photo-diode, feeds it back to the said feedback logic unit; the said feedback logic unit times the high or low electric potential of the reference signal; when the low electric potential time is too long, the feedback logic unit emits digital adjusting signal to the programmable adjusting resistor to adjust the entire electric potential and the wave crest value time of the analog output signal of the photo-diode to make the final output square wave digital signal of the comparative conversion circuit acquire a symmetric wave correction.

To enable a further understanding of the detail structure and the operation of the present invention, the brief description of the drawings below is followed by the detailed description of the preferred embodiment.

DETAILED DESCRIPTION OF THE PREFERRED EMBODIMENTS

Figure 1:
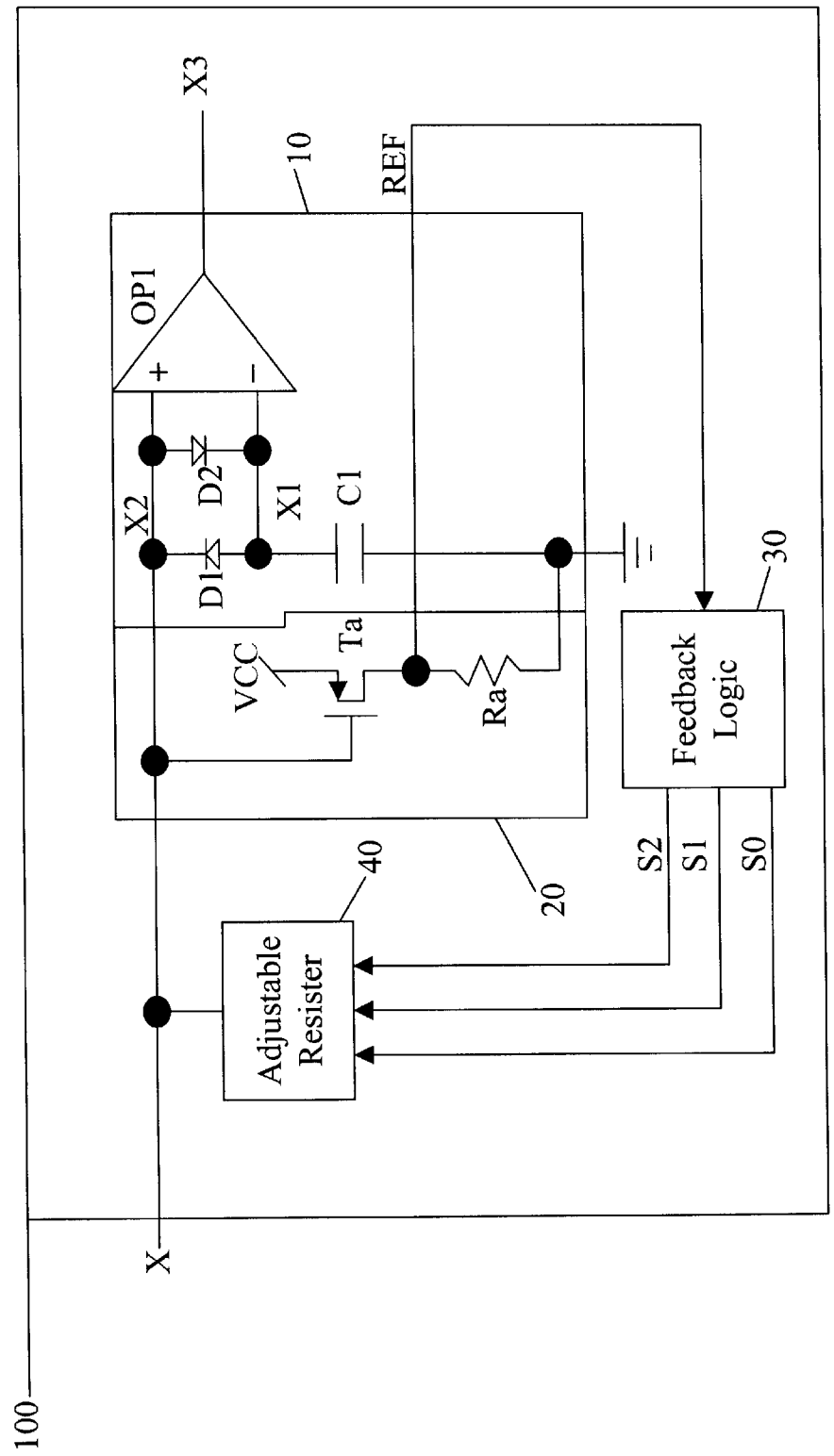
FIG. 1 is a block diagram of the system circuit of the present invention.
Figures 5, 6:
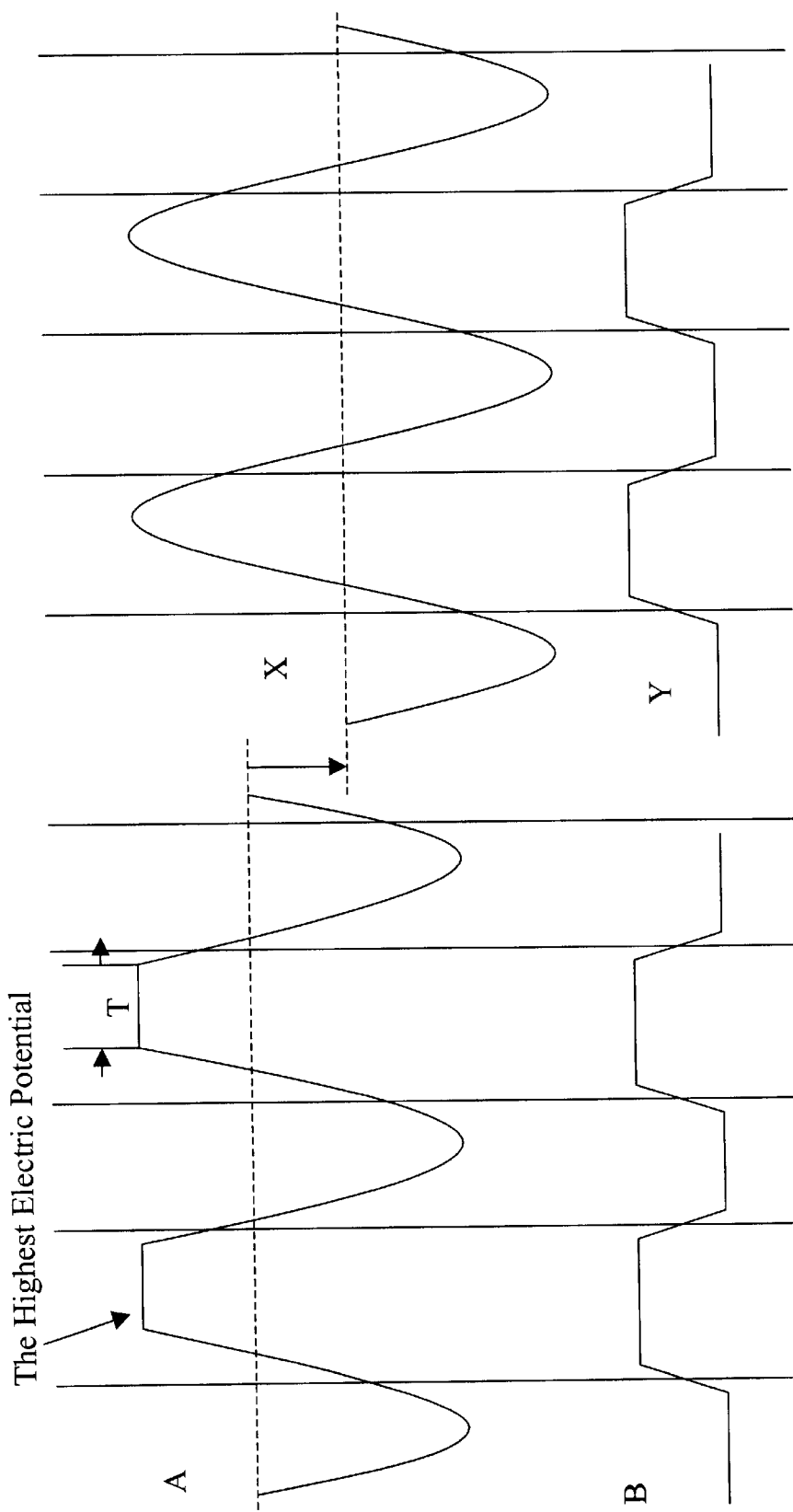
FIG. 5 is a wave drawing of the analog output signal of the photo-diode and the final output digital square wave signal.
FIG. 6 is a wave drawing of the analog output signal of a conventional photo-diode and the final output digital square wave signal.

Referring to FIG. 1, the present invention of a device for processing output signals from a photo-diode (hereafter: "an output signal processing device", referenced as "100" in the related drawings), the said output signal processing device (100) comprises a comparative conversion circuit (10), a reference circuit (20), a feedback logic unit (30) and a programmable adjusting circuit (40); wherein, the comparative conversion circuit (10) comprises at least a comparator (OP1), a plurality of diodes (D1, D2) and a capacitor (C1); the said diodes (D1, D2) are reversely engaged and then crossly connected between the negative input point (X1) and the positive input point (X2) of the comparator (OP1); the capacitor (C1) is crossly connected between the negative input point (X1) of the comparator (OP1) and the power earthing end; the said comparative conversion circuit (10) converts an analog output signal (X) of the photo-diode element to an output digital square wave signal (Y) circuit; the said analog output signal (X) is a crescent wave shape, as shown in FIG. 5 and taken as an input signal; however, the digital square wave signal (Y) is taken as an output signal; the working principles of the said comparative conversion circuit (10) are:

1. When the analog output signal (X) ascends from the lowest electric potential, the negative input point (X1)

of the comparator (OP1) maintains in the original voltage state until the voltage of the positive input point (X2) of the comparator (OP1) exceeds 0.7 volt than the negative input point (X1); at the same time, the output end (X3) of the comparator (OP1) converts to a high electric potential status; the capacitor (C1) receives the electric current charge from the diode (D2) to elevate the electric potential of the negative input point (X1) of the comparator (OP1); the electric potential of the positive input point (X2) of the comparator (OP1) will always be 0.7 volt higher than the negative input point (X1) due to the nature of the diode (D2).

2. When the analog output signal (X) ascends to the highest electric potential, the electric potential of negative input point (X1) of the comparator (OP1) will maintains at the highest electric potential minus 0.7 volt until the electric potential of the analog output signal (X) descends and becomes lower than the electric potential of the negative input point (X1) of the comparator (OP1) minus 0.7 volt; since the electric potential of the negative input point (X1) of the comparator (OP1) is higher than that of the positive input point (X2), the output end (X3) will concert from a higher electric potential (1) state to a low electric potential (0) state; at this time, the capacitor (C1) starts to discharge and maintain the electric potential of the negative input point (X1) of the comparator (OP1) 0.7 volt higher than that of the positive input point (X2) until the output analog signal (X) descends to the lowest electric potential.

3. The output end (X3) of the comparator (OP1) will change the wave of the output digital square wave signal (Y) due to the electric potential of the output analog signal (X); referring to and comparing with the wave shape shown in FIG. 5, when the output analog signal (X) ascends from the lowest electric potential to exceed 0.7 volt than the lowest electric potential, the output end (X3) of the comparator (OP1) will change from the low electric potential (0) to the high electric potential (1); when the output analog signal (X) descends from the highest electric potential to exceed the highest electric potential minus 0.7 volt, the output end (X3) of the comparator (OP1) will change from the high electric potential (1) to the low electric potential (0) and generate the output digital square wave signal (Y).

Figure 2:
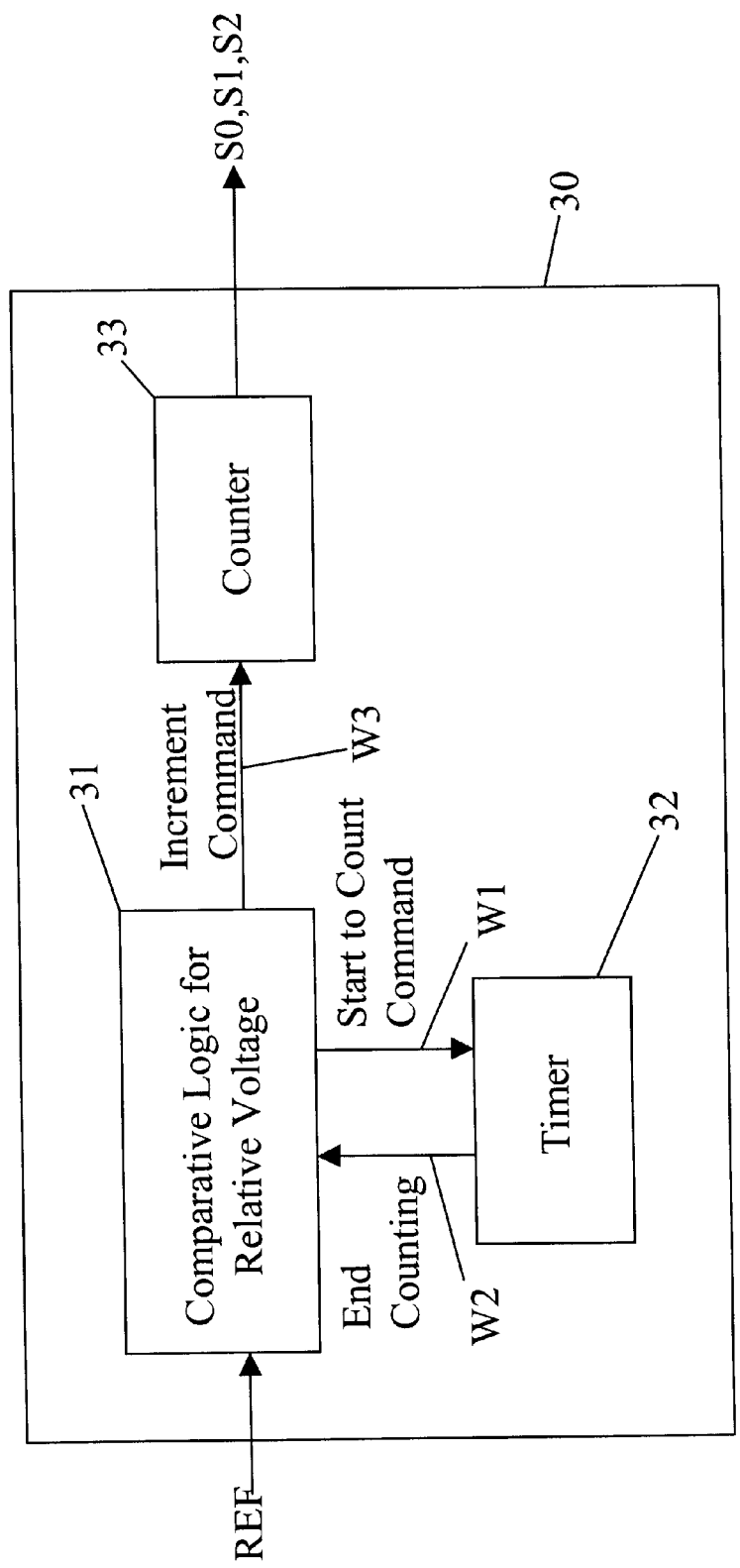
FIG. 2 is a block diagram of a feedback logic unit of the present invention.

Referring to FIG. 2, the reference circuit (20), the feedback logic circuit (30) and the programmable adjusting resistor (40) properly sample the crescent wave of the output analog signal (X) of the photo-diode in order to balance and symmetrize the wave shape between the high and low electric potentials of the digital square wave signal (Y) output from the output end (X3) of the comparator (OP1) for reference, feedback calculation, adjustment and correction to facilitate the digital square wave signal (Y) to be precisely applied to other circuits; wherein, the said reference circuit (20) used to sample the electric potential of the output analog signal (X) comprises a field-effect transistor (FET) (Ta) and a resistor (Ra), wherein, the gate pole (T1) of the FET (Ta) connects to the positive input point (X2) of the comparator (OP1) for obtaining and inducting the analog output signal (X) from the photo-diode; furthermore, the source pole (T2) of the said FET (Ta) connects to the positive end of the power (VCC); the resistor (Ra) is cascaded between the discharge pole (T3) and the power earthing end to enable the discharge pole (T3) to convert and output a reference signal (REF) to be input into the feedback logic unit (30).

Referring again to FIG. 2, showing the hardware line structure of the feedback logic unit (30), wherein, the hardware line of the said feedback logic unit (30) comprises a relative and comparative logic circuit (31), a timer (32) and a counter (33); wherein, the relative comparative logic circuit (31) receives the reference signal (REF) output from the said reference circuit (20); based on the reference signal (REF) at the low electric potential time segment, the relative and comparative logic circuit (31) sends out a timing and initial command (W1) to activate the timer (32); the timer (32) ends timing when the reference signal (REF) is at a high electric potential and feeds an end timing signal (W2) back to the relative and comparative logic circuit (31); if the timing period is too long, the relative and comparative logic circuit (31) will sent out an increment command (W3) to the counter (33) to increase the counting values (S0, S1 and S2) of the counter (33); the said counting values (S0, S1 and S2) respectively represent the digital counting bit in the binary system for inputting the detail operation method for adjusting the gross resistance value in the programmable adjusting resistor (40) to influence and change the wave shape and the electric potential of the analog output signal (X) of the photo-diode; that will be further described later.

Figure 3:
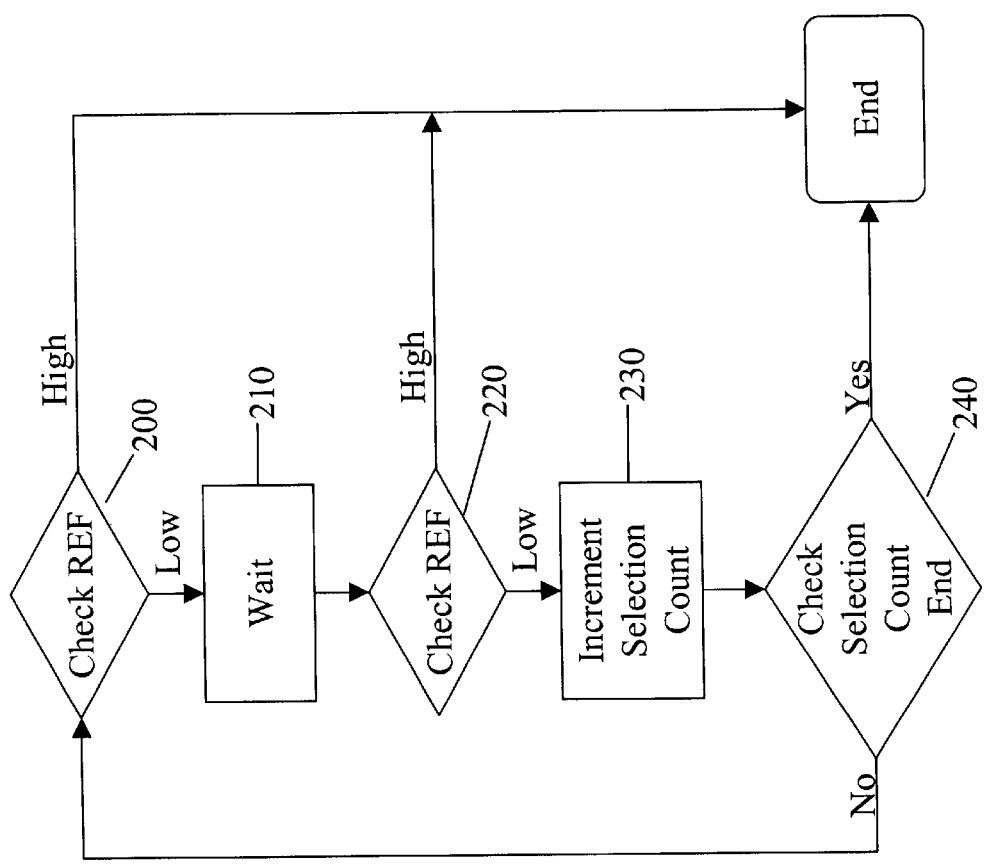
FIG. 3 is a flowchart of the signal processing of the feedback logic unit of the present invention.

Referring to FIG. 3, the flowchart of the signal processing of the feedback logic circuit (30) includes steps (200–240), wherein:

Step (200) checks the electric potential of the reference signal (REF); if it is a high electric potential, it ends directly, if low, the step (210) will be conducted.

Step (210) delays the time.

Step (220) checks again the electric potential of the reference signal (REF); if it is high, it ends directly; if still low, that means the time for being a lower electric potential is too long, then step (230) must be conducted.

Step (230) counts the value increment, that means, increases the counting values (S0, S1 and S2).

Step (240) checks to see whether the counting ends; if yes, it ends directly; if not, step (200) is repeated.

From the description of the hardware line and signal processing flowchart of the feedback logic unit (30) shown in FIGS. 2 and 3, it is understandable that the said feedback logic unit (30) is limited to comprise the hardware line; for example, the signal processing flowchart in FIG. 3, comprises the software method existed in a microprocessor and checks the electrical potential of the reference signal and generates increment for the counting values (S0, S1 and S2) for the programmable adjusting resistor (40) to conduct the wave shape adjustment and the electric potential of the analog output signal (X).

Figure 4:
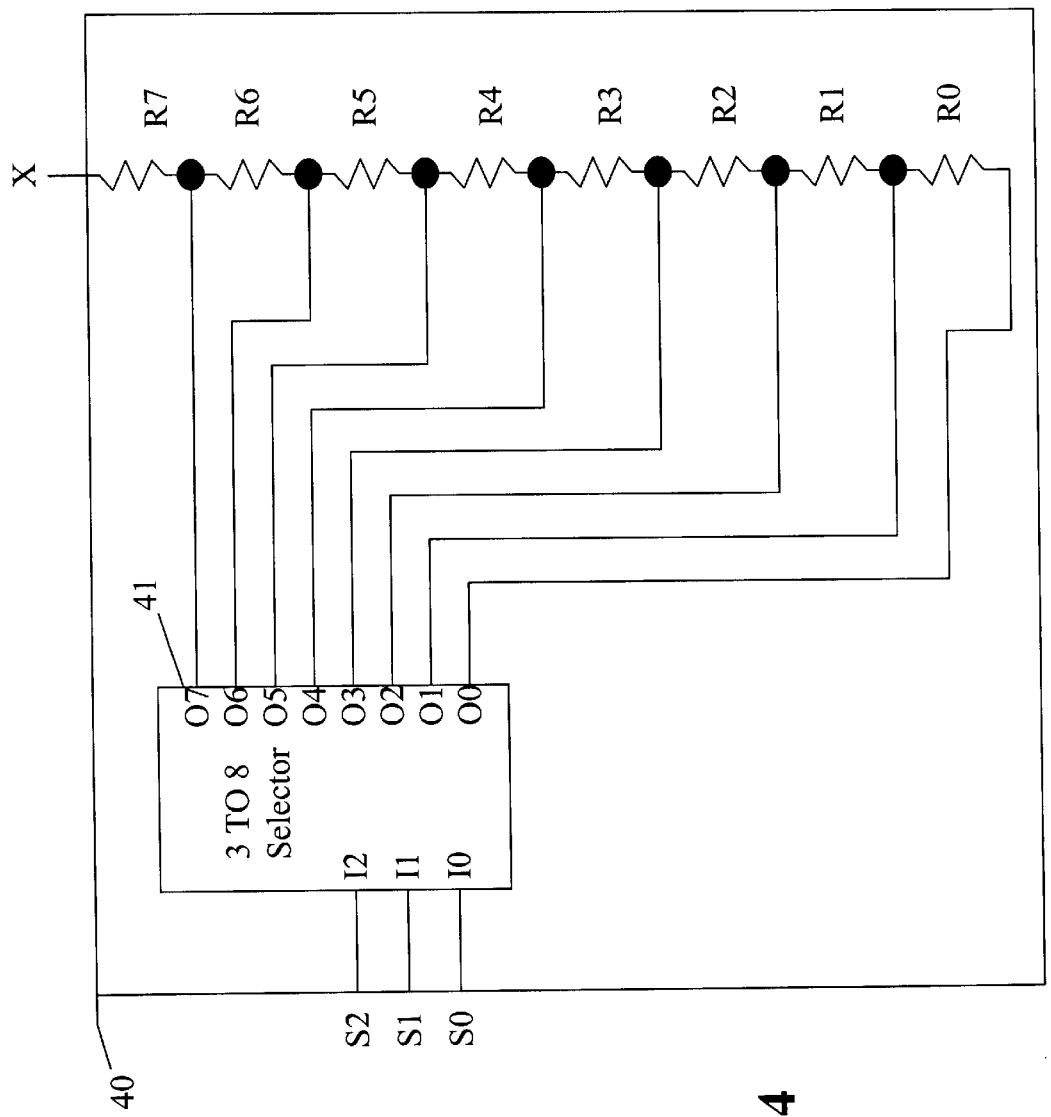
FIG. 4 is a circuit diagram of a programmable adjusting resistor of the present invention.

Referring to FIG. 4, the circuit diagram of a programmable adjusting resistor (40) of the present invention, wherein, a selector (41) and a plurality of pressure division resistors (R0–R7) are included; the said selector (41) is a selection line with three inputs for eight outputs; the input ends (10, 11 and 12) are provided for inputting the counting values (S0, S1 and S2) output by the said feedback logic unit (30); the pressure division resistors (R0–R7) are respectively and sequentially cascaded to form jointed points (N0–N7); all of the jointed points (N)–N7) respectively and correspondingly connect to the eight output ends (00–07) of the selector (41) to enable the output ends (00–07) to output through the low (earthing) electric potential for representing the selected values thereof; furthermore, the pressure division resistor (R7) at the highest electric potential is connected to the positive input point (X2) of the comparator (OP1) of the said comparative conversion circuit (10) for connecting to the input path of the analog output signal (X)

to further influence and change the wave shape and the electric potential of the said analog output signal (X).

The working principles of the said programmable adjusting resistor (40) are:

1. The counting values (S0, S1 and S2) are the selected signals of the programmable adjusting resistor (40); when the counting values (S0, S1 and S2) are in the initial state, the feedback logic unit (30) sets the relative electric potentials of the three counting values (S0, S1 and S2) at the initial electric potentials (the low electric potentials); these initial electric potentials place the programmable adjusting resistor (40) at the position with highest gross resistance value, that means, the output ends (00) is at a low electric potential.

2. At the initial state, the feedback logic unit (30) uses the reference signal (REF) to recognize the electric potential relative to the analog output signal (X); for example, if the electric potential of the output analog signal (X) is 0.7 volt higher than that of the power positive end (VCC), then the reference signal (REF) obtains a low electric potential value; if the reference signal (REF) stays at the low electric potential value for too long, the feedback logic unit (30) will use the software signal processing flowchart, the relative and comparative logic circuit (31) of the hardware line and the timer (32) to check as well as utilize the counter (33) to increase the counting values (S1, S2 and S2) to select the pressure division resistors (R1–R7) at a high potential for reducing the gross resistance value of the programmable adjusting resistor (40).

3. When the gross resistance value of the programmable adjusting resistor (40) is reduced, the entire electric potential of the analog output signal (X) from the photo-diode will be reduced too; comparing FIGS. 5 and 6, it is understandable that the time segment at the highest electric potential (the positive semi-cycle crest value) of the positive crescent wave of the analog output signal (X) will also shrink to have the effect of adjusting and correcting the wave shape to symmetric and balanced, thereby, to make the wave shapes of the high and the low electric potentials of the digital square wave signal (Y) output finally from the comparative conversion circuit (10) into symmetric and balanced wave shapes, as shown in FIG. 5.

Referring to FIG. 5, a wave comparison of the analog output signal (X) of the photo-diode and the digital square wave signal (Y), as indicated and relative to the comparison with a conventional signal wave shape in FIG. 6, it specifically proves that the output signal processing device (100) of the present invention, under the premise of automatically feedback adjustment, allows the digital square wave signal (Y) output finally from the photo-diode to obtain the best balanced and symmetric wave shape advantageous for the other circuits to apply and applicable to all of the pairing-up between the photo-diode and light-emitting diode; it is not limited by the nature of the light-emitting diode, will not be influenced by the long-term deterioration of these two photo-electric diodes, requires no manual or apparatus testing before pairing up for application and significantly saves the laboring time, the manpower and the cost.

It is of course to be understood that the embodiments described from FIG. 1 to FIG. 5 are merely illustrative of the principles of the invention and that a wide variety of modifications thereto may be effected by persons skilled in the art without departing from the spirit and scope of the invention as set forth in the following claims.

What is claimed is:

1. A device for processing output signals from a photo-diode comprising:

a comparative conversion circuit receiving, inputting an analog output signal from the photo-diode and converting the analog output signal to a relative and digital square wave signal for outputting;

a reference circuit inducting the analog output signal from the photo-diode and converting it into a reference signal for outputting;

a feedback logic unit connecting and inputting the reference signal output from the reference circuit, checking a high or low electric potential of the reference signal, outputting a plurality of counting values of digital bits based on the high or low electric potential state of the reference signal, increasing and outputting the counting values being under the state of low electric potential for too long;

a programmable adjusting resistor connecting to the input path of the analog output signal of the comparative conversion circuit and receiving the counting values from the feedback logic unit to respectively adjust a high or low gross resistance value based on the counting value thereby to influence and adjust the electric potential and the wave shape of the said analog output signal to make the time segment high or low electric potential of the digital square wave signal be adjusted synchronously.

2. The device for processing output signals from a photo-diode according to claim 1, wherein the comparative conversion circuit has a comparator, a plurality of diodes and a capacitor.

3. The device for processing output signals from a photo-diode according to claim 2, wherein said plurality of diodes are engaged reversely and connected crossly between a negative input point and a positive input point, the capacitor is crossly connected between the negative input point and an earthing end.

4. The device for processing output signals from a photo-diode according to claim 1, wherein the reference circuit has a field-effect transistor and a resistor.

5. The device for processing output signals from a photo-diode according to claim 4, wherein a gate pole of the field-effect transistor inducts the analog output signal from the photo-diode, a source pole is connected to a positive end of a power source and the resistor is crossly connected between a discharge pole and a power earthing end.

6. The device for processing output signals from a photo-diode according to claim 1, wherein the said feedback logic unit comprises:

a relative and comparative logic circuit for connecting and inputting reference signal and checking the high or low electric potential of the reference signal;

a timer controlled by timing the relative and comparative logic circuit; the timer starts to time when the reference signal is at a low electric potential and ends timing when the reference signal is at a high electric potential;

a counter controlled by the relative and comparative logic circuit for outputting counting values; at low electric potential, the relative and comparative logic circuit sends out increment counting command for increasing the output counting values.

7. The device for processing output signals from a photo-diode according to claim 1, wherein the programmable adjusting resistor comprises:

a selector with a plurality of input ends and output ends; the input ends input the counting value output from the feedback logic unit; based on the counting value, it relatively selects an output end to output a low electric potential;

a plurality of pressure division resistors cascaded into a plurality of jointed points to respectively connect to every corresponding output end of the selector; the resistor of the highest output end of the selector connects with the analog output signal from the photodiode thereby to change the electric potential and the wave shape of the analog output signal through the gross resistance value of the pressure division resistor.

8. The device for processing output signals from a photodiode according to claim 7, wherein the selector has three inputs for eight outputs.

* * * * *